United States Patent
Shuttleworth et al.

(10) Patent No.: US 8,005,231 B2
(45) Date of Patent: Aug. 23, 2011

(54) AMBIENT NOISE SOUND LEVEL COMPENSATION

(75) Inventors: Timothy J. Shuttleworth, Woodland Hills, CA (US); Richard A. Kreifeldt, Sandy, UT (US); C. Rex Reed, Salt Lake City, UT (US); Brian R. Ellison, Salt Lake City, UT (US)

(73) Assignee: Harman International Industries, Incorporated, Northridge, CA (US)

( * ) Notice: Subject to any disclaimer, the term of this patent is extended or adjusted under 35 U.S.C. 154(b) by 904 days.

(21) Appl. No.: 11/944,016

(22) Filed: Nov. 21, 2007

(65) Prior Publication Data

US 2008/0069365 A1 Mar. 20, 2008

Related U.S. Application Data

(63) Continuation of application No. 10/669,290, filed on Sep. 24, 2003, now Pat. No. 7,333,618.

(51) Int. Cl.
*H03G 3/20* (2006.01)

(52) U.S. Cl. .......................................... 381/57

(58) Field of Classification Search .............. 381/56–58, 381/103, 107, 108, 96, 94.1–94.3, 92, 1
See application file for complete search history.

(56) References Cited

U.S. PATENT DOCUMENTS

| | | | |
|---|---|---|---|
| 4,479,237 A | 10/1984 | Sugasawa | |
| 4,641,344 A | 2/1987 | Kasai et al. | |
| 4,845,758 A * | 7/1989 | Op de Beek et al. | 381/98 |
| 4,944,018 A | 7/1990 | Bose et al. | |
| 5,208,866 A | 5/1993 | Kato et al. | |
| 5,872,852 A | 2/1999 | Dougherty | |
| 5,907,622 A * | 5/1999 | Dougherty | 381/57 |
| 6,606,391 B2 * | 8/2003 | Brennan et al. | 381/316 |
| 6,805,633 B2 * | 10/2004 | Hein et al. | 463/35 |
| 7,054,448 B2 * | 5/2006 | Yoshino et al. | 381/59 |
| 7,171,010 B2 * | 1/2007 | Martin et al. | 381/98 |
| 7,333,618 B2 * | 2/2008 | Shuttleworth et al. | 381/57 |

OTHER PUBLICATIONS

Brochure for Lyntec CrowdComp, http://www.lyntec.com/body_c3.htm, downloaded Jun. 25, 2003 ( 2 pages).
*The LynTec CrowdComp™ always knows when to speak UP*, http://www.lyntec.com/139-0146-01_C3_Broch.pdf, downloaded Jun. 25, 2003 (4 pages).
*Symetrix 371 SPL Computer*, http://www.symetrixaudio.com/Products/371.htm, downloaded Jun. 25, 2003 (2 pages).

(Continued)

*Primary Examiner* — Xu Mei
*Assistant Examiner* — Lun-See Lao

(57) ABSTRACT

A system includes a variable amplifier, a source sound processor, an area sound processor, and an adjustment circuit. The variable amplifier adjusts an audio input signal to generate an audio output signal with an appropriate level so that the audio output signal is audible over noise in a listening area. The source sound processor and the area sound processor may split the audio output signal and a monitoring signal into frequency bands, and may compare these signals band-by-band to find differences that represent time-varying noise in the monitoring signal. These differences may be modified to account for the acoustic response of the listening area and for constant-level background noise in the listening area. The adjustment circuit controls the variable amplifier in response to these differences.

10 Claims, 7 Drawing Sheets

OTHER PUBLICATIONS

Datasheet for Symetrix 371 SPL Computer, 2001, "371data.pdf," downloaded from http://www.symetrixaudio.com/ on Jun. 25, 2003 (2 pages).

Circuit drawing for Symetrix 371 SPL Computer, Oct. 30, 2000, "371flow.pdf," downloaded from http://www.symetrixaudio.com/ on Jun. 25, 2003 (pp. 1).

*SPL Computer User's Guide Rev B.02*, Jun. 2001, "371ug_0b02.pdf," downloaded from http://www.symetrixaudio.com on Jun. 25, 2003 (27 pages).

*Biamp Systems Signal Processors*, http://www.biamp.com/products/signal/, downloaded Jul. 29, 2003 (5 pages).

*ANC22 Ambient Noise Compensator Operation Manual*, Nov. 2, 1998, "ancmnl.pdf," downloaded from http://www.biamp.com (14 pages).

Brochure for Biamp ANC22 Ambient Noise Compensator, http://www.biamp.com/products/pdf/ANC22brc.pdf, downloaded Jun. 25, 2003 (2 pages).

Jubien, Chris, et al., *Noise Sensing Using a Variation of the nLMS Adaptive Filter with Auto Calibration, Mackie Industrial White Paper*, Sep. 2000, downloaded from http://www.mackie.com/products/pdf/spdsp-1_wp.pdf on Jun. 25, 2003 (12 pages).

\* cited by examiner

AMBIENT NOISE SOUND LEVEL COMPENSATION

PRIORITY CLAIM

This application is a continuation application of co-pending U.S. patent application Ser. No. 10/669,290, filed Sep. 24, 2003, which is incorporated by reference.

BACKGROUND OF THE INVENTION

1. Technical Field

The invention generally relates to sound processing systems. More particularly, the invention relates to sound processing systems that adjust the sound output of the system based on the noise level in a listening area.

2. Related Art

Listening environments tend to have some amount of background or ambient noise. This noise is a challenge to sound-system designers, especially when the background or ambient noise is large or has a time-varying intensity. A sound system designer generally tries to play sound—such as music or voice—with enough volume that the sound being played can be heard over the background or ambient noise. The sound being played may come from a live or recorded audio source signal. This source signal may be a digital or analog electronic representation of the sound desired for a listening area. The source signal needs to be generated with enough strength that the resulting sound is audible over the background or ambient noise. Hence, sound-system designers may measure the background or ambient noise in a listening area and adjust the sound level of the source signal accordingly.

By determining the strength of the noise present, system designers can select an appropriate strength for the source signal, so that the sound being played has an adequate volume. This procedure may be done as part of a pre-performance calibration, such as a "sound check," in which an audio system is empirically calibrated prior to use. A pre-performance calibration lets technicians select a strength for a source signal, so that the broadcast sound has an adequate volume for the acoustic properties and the noise in a particular listening area.

However, this solution may be insufficient when the noise in a listening area varies over time. The noise level can vary over time due to a variety of independently changing factors, such as the presence of people in the listening area, the foot traffic of people in the listening area, the number of the conversations of the people, the volume of the conversations, and the operation of machinery such as air handling units and the like. If the listening area is an outdoor location, there are additional factors that contribute to the time-varying noise, such as rain, wind, and nearby vehicular traffic.

Further, in some listening areas, some factors may be more pronounced than others, especially variable noise sources such as the operation of an air handling unit, vehicle noise, and the like. The variable noise sources can cycle between louder and softer noise levels during operation, increasing and decreasing the noise in the listening area. The noise measured during a pre-performance calibration might therefore not be a good representation of the ambient or background noise that occurs during a performance. Thus, although it may be helpful, a one-time calibration is not a full solution to the challenge of time-varying ambient noise.

A better approach is to use real-time measurements of the noise, with ongoing adjustments of the source signal's strength. The level of the source signal (which may be the source signal's amplitude or intensity or power) may then be increased in response to an increase in the noise and decreased in response to a decrease in the noise. This solution involves determining the level of ambient noise while the source signal is being played—for example, measuring the volume of crowd noise, weather, and machinery while a concert or other event is being performed—and adjusting the source signal's level as that ambient noise changes. This approach involves some additional challenges.

One challenge is to measure the sound level in the listening area and ascertain how much of that sound is noise and how much is from the source signal being projected into the listening area. A microphone may be used in the listening area to monitor the ambient sound, which is a combination of the desired sound and the ambient or background noise in the listening area. This combination of monitored sounds may be represented as a microphone signal, which may be understood as a combination of the source signal and the received noise. The microphone signal is a valuable tool for monitoring the listening area and providing feedback on the sounds being experienced in the listening area. Existing systems may fail to take account of the fact that by monitoring the listening area, a measurement microphone hears the extraneous noise as well as the desired sounds. Thus, these systems may essentially attenuate the sound being played in response to itself, which is not a desired solution.

Another technique for estimating the received noise is to subtract a scaled r.m.s. level of the source signal from the microphone signal. One of the main shortcomings of this approach is that it operates on the full audio band signal received at the microphone such that the r.m.s. value determined can be affected by the frequency response from loudspeakers to microphone. The potential error in the r.m.s. computation from this mechanism can exceed the level difference caused by extraneous noise sources in the room.

Another technique for estimating the received extraneous noise subtracts the source signal from the received microphone signal in the time domain. The technique measures the frequency response (or transfer function) from loudspeaker(s) to microphone and applies a complex frequency correction equalizer created in the digital domain as a Finite Impulse Response filter (FIR) and applies time delay to the source signal in an attempt to make both signal equivalent in the absence of extraneous noise. Because it is based on a time-domain comparison between the source signal and the microphone signal, this approach is largely insensitive to the frequency distribution of the noise and source signals. Further, the time delay for a signal to go from the source, such as a speaker or system of speakers, to the measurement microphone, is affected by factors such as the number and type of loudspeakers used in a sound system, placement of the loudspeakers, proximity of the loudspeakers to the measurement microphone, reverberant standing waves, and multiple signals arriving at the measurement microphone due to signal reflections, signal echoes, and multiple signals due to multiple loudspeakers. These delay factors result in a variety of delays known as time smear. Because of the variety of factors that contribute to these delays, a real-time time-domain approach may be of limited reliability for comparing a microphone signal to a source signal.

Yet another existing approach uses a fast Fourier transform to determine the level of noise present in a microphone signal. This approach is relatively complex, and involves a processing-intensive complete Fourier decomposition of the entire microphone signal.

Other approaches are limited to special applications, such as automotive sound systems, where special knowledge of the noise may be obtained from sources other than a microphone signal. For example, in the passenger compartment of an automobile, the main sources of extraneous noise include wind, tire noise, and engine noise. The level of these noise sources can be anticipated by inputs such as vehicle speed and engine speed, and the volume of the automobile's stereo system may be automatically adjusted. These approaches are not readily adaptable to more general situations, where the main indication of background or ambient noise is a microphone signal or some other input in which noise is combined with a desired sound.

SUMMARY

Described herein are various embodiments of a system and a method for noise compensation. The compensation adjusts the level of a desired sound projected into a listening area so that the desired sound is audible over undesirable noise, whose sound level may vary over time in the listening area.

The techniques discussed here may be used by a system designer in a variety of combinations to provide an appropriate combination of benefits. Some of the techniques described herein enhance sensitivity to narrowband noise by using a multiband approach to noise analysis. Similar techniques may be used to enhance the sensitivity to small changes in a listening area's acoustic properties. Further, some of these techniques may be optimized for relatively simple digital signal processing (DSP) architectures, and for particular applications, without needing a full frequency analysis. Additionally, some of the calibration tools described herein provide a degree of immunity to time domain artifacts, such as transient noise during calibrations. In some examples of the system, different types of noise may be given an increased or decreased importance when determining the appropriate amount of compensation. Some of the various approaches to signal processing described herein involve the use of logarithmic representations of signal levels. These representations may be useful for simplifying calculations, since arithmetic differences in values may then be used to represent signal to noise ratios (SNR). This feature may be used to simplify the tracking of error signals, may enhance the tracking of error signals, and may be used to simplify the implementation of a maximum boost level.

One example of the system includes a variable amplifier, a source sound processor, an area sound processor, and an adjustment circuit. The variable amplifier receives an audio input signal, which may be an analog or digital signal that carries a desired sound, such as voice, music or other audio. The variable amplifier amplifies or attenuates the audio input signal to generate an audio output signal. The amplified or attenuated audio output signal is provided to speakers or other equipment so that the desired sound may be projected into a listening area.

The adjustment circuit provides an adjustment signal to the variable amplifier. This adjustment signal may specify the amount of amplification or attenuation to be used in the variable amplifier, so that the resulting audio output signal has an appropriate level to be audible over noise that may be present in the listening area. To create the adjustment signal, the adjustment circuit may use information about the audio output signal, information about the total ambient sound in the listening area, information about the acoustic response of the listening area, and information about substantially constant-level background noise in the listening area, as well as other measurements and reference information.

So that the adjustment circuit can gather real-time information on the audio output signal, the audio output signal may be provided to the source sound processor, which is connected to the adjustment circuit. The source sound processor may split the audio output signal into a set of audio output levels. The source sound processor may include a filter bank, a running-average block, and a logarithm block. The filter bank has a set of bandpass filters that receive the audio output signal and generate a set of bandpass signals. For example, the filter bank may include eight bandpass filters, with frequency bands of about 100 Hz to about 145 Hz, about 145 Hz to about 211 Hz, about 211 Hz to about 307 Hz, about 307 Hz to about 447 Hz, about 447 Hz to about 650 Hz, about 650 Hz to about 944 Hz, about 944 Hz to about 1372 Hz, and about 1372 Hz to about 2000 Hz. These eight bandpass filters would generate eight bandpass signals, which are corresponding band-limited versions of the audio output signal.

The running-average block receives the bandpass signals from the filter bank, rectifies the bandpass signals, and calculates a set of running averages of absolute values for the set of bandpass signals. The running averages are sent to the logarithm block, which generates the set of audio output levels by finding logarithms of the running averages. The logarithms of the running averages may then be used as the audio output levels, indicating the amount of signal that is present in each of the frequency bands for the audio output signal.

Each of the audio output levels indicates a signal level of the audio output signal in one of the filter bank's frequency ranges. For example, one of the audio output levels may measure the amount of the audio output signal's signal power in the 944 Hz to 1372 Hz frequency range.

The area sound processor may provide the adjustment circuit with information about the ambient sounds in the listening area. The area sound processor may receive an ambient sound input signal, such as a microphone signal, and convert the ambient sound input signal into a set of ambient sound levels. One example of the area sound processor includes: a filter bank with bandpass filters that split the ambient sound input signal into a second set of bandpass signals, a running-average block that calculates running averages of absolute values for the second set of bandpass signals, and a logarithm block that calculates logarithms of the running averages to generate a set of ambient sound levels.

The area sound processor may also include a memory, a gain stage, and a background removal stage. The memory in the area sound processor may hold information on (1) the acoustic properties of the listening area and (2) the substantially constant background noise in the listening area. This information may be obtained, for example, during a pre-performance calibration of the system. The gain stage may use the information on the acoustic properties of the listening area to substantially remove the effects of these acoustic properties from the ambient sound input signal. Similarly, the background removal stage may use the information on the substantially constant background noise to substantially remove the effects of the background noise from the ambient sound input signal. Thus, the resulting ambient sound levels calculated in the area sound processor represent the desired sounds in the listening area, plus any time-varying ambient noise in the listening area.

The adjustment circuit receives the ambient sound levels (representing the sounds desired for the listening area, plus any time-varying ambient noise in the listening area) from the area sound processor. The adjustment circuit also receives the audio output levels (representing the desired sounds in the listening area) from the source sound processor. By comparing these signals, the adjustment circuit may generate the adjustment signal, which effectively represents only the time-varying ambient noise in the listening area.

The comparison in the adjustment circuit may assign varying weights to each of the frequency bands. The adjustment circuit may also use a sensitivity level—a user parameter that indicates the desired margin between the time-varying ambient noise and the desired sound. This sensitivity level may be subtracted from the adjustment signal in the adjustment circuit. Prior to providing the adjustment signal to the variable amplifier, the adjustment circuit may also integrate the adjustment signal in time, giving the system a response time to changes in the ambient noise. The response time may be selected to be about 30 seconds.

The adjustment circuit may also receive another user parameter, such as a max boost setting, that is used to cap the adjustment signal. By limiting the adjustment signal in this way, the system prevents the audio output signal from exceeding a desired level. For the comfort of an audience in the listening area, they system's operators may choose an appropriate max boost setting for the system, thereby preventing the output signal from being excessive.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION

This disclosure presents methods and systems for controlling the level of a desired sound signal to compensate for noise in a listening area. The methods and systems measure the level of a monitoring signal, such as a microphone signal, that is a combination of a desired source sound and undesired noise, and then calculate a noise level by subtracting a source signal level from the microphone signal level. The analyses may be performed separately for separate frequency bands. The separate frequency bands may be analyzed in parallel or sequentially.

Figure 1:
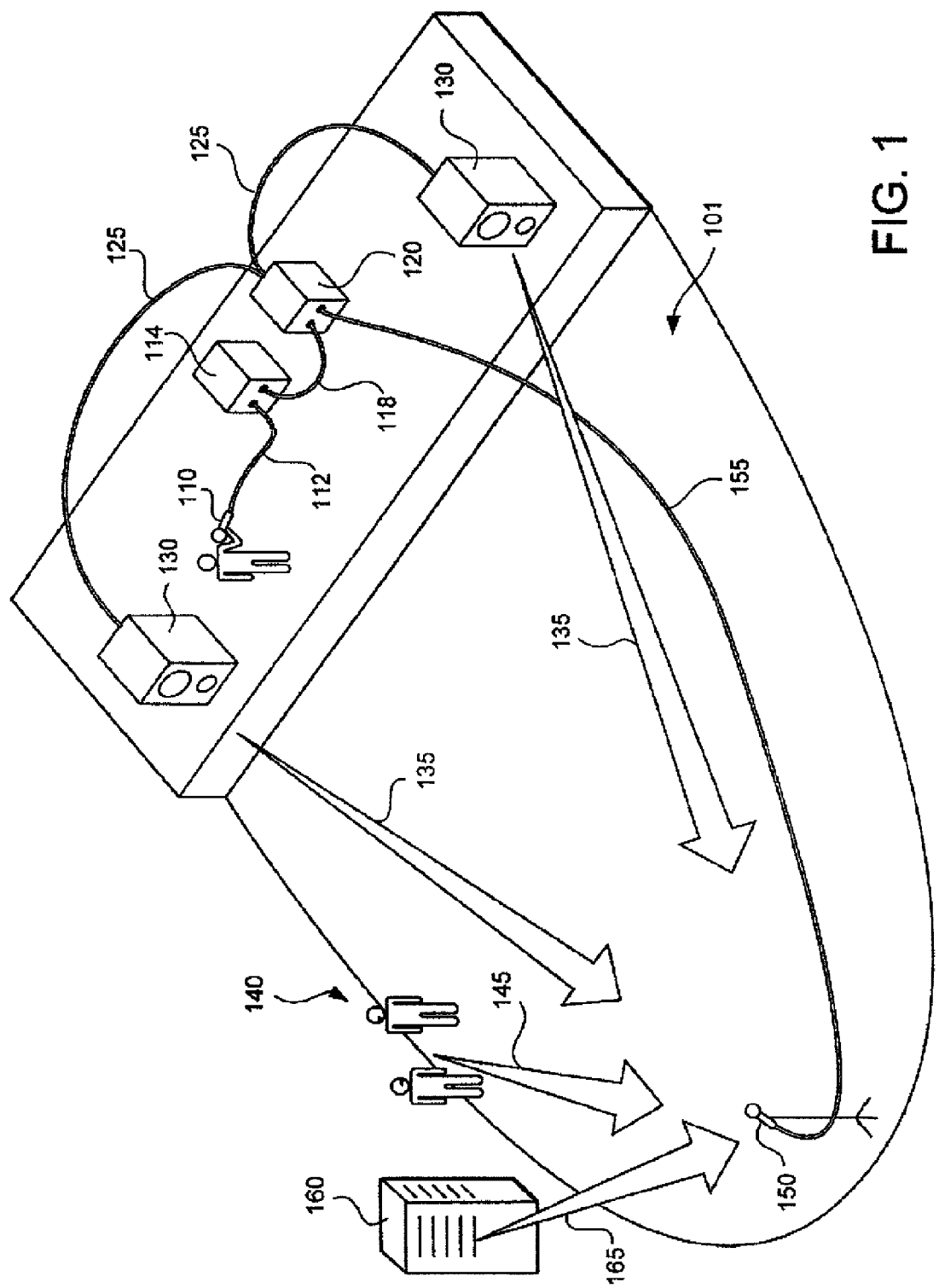
FIG. 1 depicts an environment in which compensation may be used to address background noise and time-varying ambient noise.

FIG. 1 depicts an environment in which an audio system projects sound waves that need to be audible over undesired environmental noise. A listening area 101 is shown as a space into which sound may be projected through speakers 130 for the benefit of an audience. The sound being projected is generated by an audio source 114, represented in the figure as an audio amplifier. Other possible sources 114 include a variety of audio equipment, including CD players, public address systems, digital audio equipment, specialized electronics for concert acoustics, and other sources. In the depiction of FIG. 1, the audio source 114 receives a live voice signal 112 via a cable from a source microphone 110. Of course, other source detectors are possible, such as piezoelectric transducers. The audio source 114 generates a source signal 118 and transmits the source signal 118 to a noise compensation unit 120. The noise compensation unit 120 modifies the source signal 118, as discussed below, to generate an output signal 125. The output signal 125 is then provided, for example via additional amplifiers (not shown), to the speakers 130, and is projected as speaker sound waves 135 into the listening area 101.

In order for the sound being played to be adequately audible, the volume generally is maintained above the noise level in the listening area 101. However, the sound being played generally should not be much louder than necessary, and the sound should not exceed a maximum level. For the benefit of an audience hearing the sound being played in the listening area 101, the noise compensation unit 120 adjusts the output signal 125 as needed to ensure that the speaker sound waves 135 are audible over any undesirable noise present in the listening area 101. The noise compensation unit 120 may maintain the played sound at a level greater than the noise level in the listening area 101. Additionally, for the comfort of people in the listening area, the noise compensation unit 120 may be designed to ensure that the sound being played does not exceed some pre-determined maximum level. In order to make these adjustments, the noise compensation unit 120 receives information about the noise level in the listening area 101. Such information may be obtained by a microphone 150 located at or near the listening area 101, and may be provided to the noise compensation unit 120 through a microphone signal 155.

One or more microphones 150 may be used, and their placement may be selected to detect sounds that would be heard by an intended audience. These sounds include the speaker sound waves 135 that are generated by the speakers 130, and which project the desired sounds from the source signal 118. However, the sounds heard by the intended audience and by microphone 150 also include undesired noise of various types.

It is helpful to recognize that the noise in the listening area 101 may be categorized as a combination of a background noise 165, which tends to persists at a roughly constant level over time, plus an ambient noise 145, which is an additional noise with a sound level that varies over time. The noise detected by microphone 150 generally includes both background noise 165, typically generated by background noise sources 160, and time-varying ambient noise 145, typically generated by ambient noise sources 140. The background noise sources 160 are represented in the figure by a power generation unit. These sources 160 operate continuously and may not be completely turned off. Other examples of background noise sources 160 include the normal air flow patterns in a building, air conditioners, heating and ventilation units, power generators, and other machinery that cannot be fully silenced. Noise from these sources may be especially noticeable in a closed listening area. It is expected that the background noise sources 160 can be operated at some minimum sound level during calibrations, but that this minimum sound level is likely nonzero. The background noise sources 160 thus generate some minimum background noise 165 that is directed into the listening area 101 at all times. The minimum-level background noise 165 may be understood as constant, in the sense that it has a substantially time-independent frequency distribution. The background noise 165 is the minimum distribution of noise that may be expected at any time in the listening area.

In addition to the minimum background noise 165, the listening area is subject to the time-varying ambient noise 145. In the figure, the ambient noise 145 is depicted as crowd noise, and the ambient noise source 140 is depicted as audience members engaged in speaking, moving, and walking. This crowd noise has a time-varying sound level, getting louder and softer as the audience size swells and shrinks. Other sources 140 of the time-varying ambient noise 145 include weather, passing traffic, and operating machinery. The ambient noise sources 140 may also include the background noise sources 160, which may be expected to occasionally generate additional noise exceeding the level of the minimum background noise 165.

The microphone 150 detects a superposition of sounds that includes: the speaker sound waves 135, the minimum background noise 165, and the time-varying ambient noise 145. The microphone signal 155 generated by microphone 150 thus represents a combination of these three sounds 135, 145, and 165. This combination is provided in microphone signal 155 to the noise compensation unit 120. As discussed below, one of the initial tasks for the noise compensation unit 120 is to extract information about the time-varying ambient noise 145 from the microphone signal 155.

In addition to the background and ambient noise, the acoustic characteristics of the listening area also affect the microphone signal 155 detected by microphone 150 and may cause it to differ from the output signal 125 that is provided to the speakers 130. The listening area 101 may have a non-flat frequency response that alters the speaker sound waves 135 as they travel from speakers 130 to microphone 150. For example, some frequency ranges may be more attenuated than others in the listening area. The variations in frequency response may arise from the material used in construction of the listening area, the architecture of the listening area, furniture, carpeting, and drapery in the listening area, and other physical properties of the listening area. The variations in frequency response may also be due to factors such as the number and type of loudspeakers used in a sound system, placement of the loudspeakers, proximity of the loudspeakers to the measurement microphone 150, reverberant standing waves, and single signals arriving at the measurement microphone multiple times due to reflections, echoes, and multiple loudspeakers. As described below, one approach to quantifying the acoustic characteristics of the listening area is to measure an acoustic transfer function of the listening area.

A number of variations of depicted in FIG. 1 are possible. For example, the listening area 101 may be an indoor or outdoor location. The source signal 118 may be any of a variety of sound signals, including single or multiple voices or instruments, as live or prerecorded signals or as combinations of these varieties of sound signals. The source signal 118, the microphone signal 155, and the output signal 125 may be communicated by signal cables, as shown, or may be transmitted wirelessly, such as through radio or infrared signals. Further, the signals 118, 125, and 155 may each be in analog or digital form. Other variations of the listening area 101 and the equipment configuration are also possible, as would be understood to one skilled in the design of audio systems.

Figure 2:
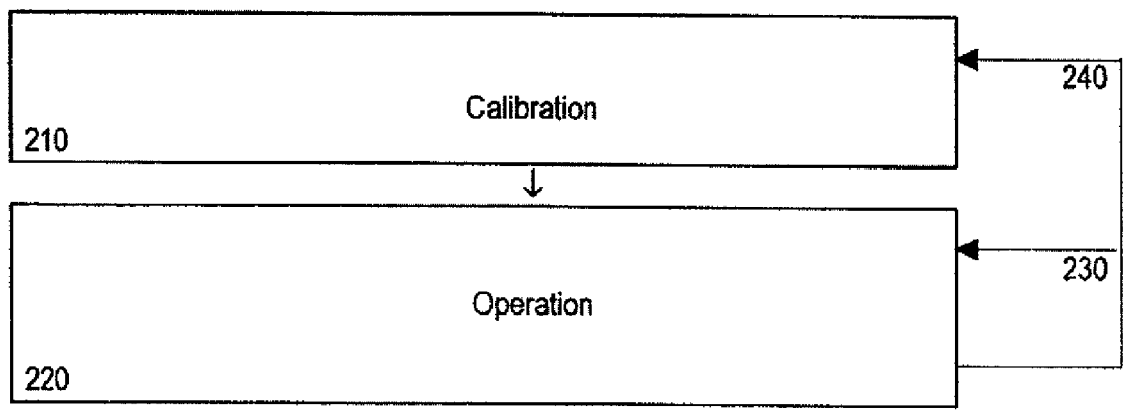
FIG. 2 is a flowchart outlining an example of a method for compensating for noise in a listening area.

FIG. 2 is a flowchart outlining a method for compensating for noise in a listening area, such as the listening area 101 from FIG. 1. This example includes two phases: an initial calibration phase 210 and an operation phase 220. The calibration phase 210 is preferably conducted under controlled conditions, preferably with no audience present, prior to the operation phase 220. The calibration phase 210 gathers information about the listening area 101 and the background noise 165 in the listening area. The operation phase 220 occurs later, and may be the period of time when an audience is present to experience the desired sound signals in the listening area 101.

The information gathered during the calibration phase 210 is used later to enhance the performance during the operation phase 220. As indicated by looping arrow 230, the operation phase involves an ongoing or iterative compensation of the noise in the listening area 101. An additional level of iteration may also be employed, as indicated by looping arrow 240, by repeating the calibration between performances or even occasionally during performances.

Figure 3:
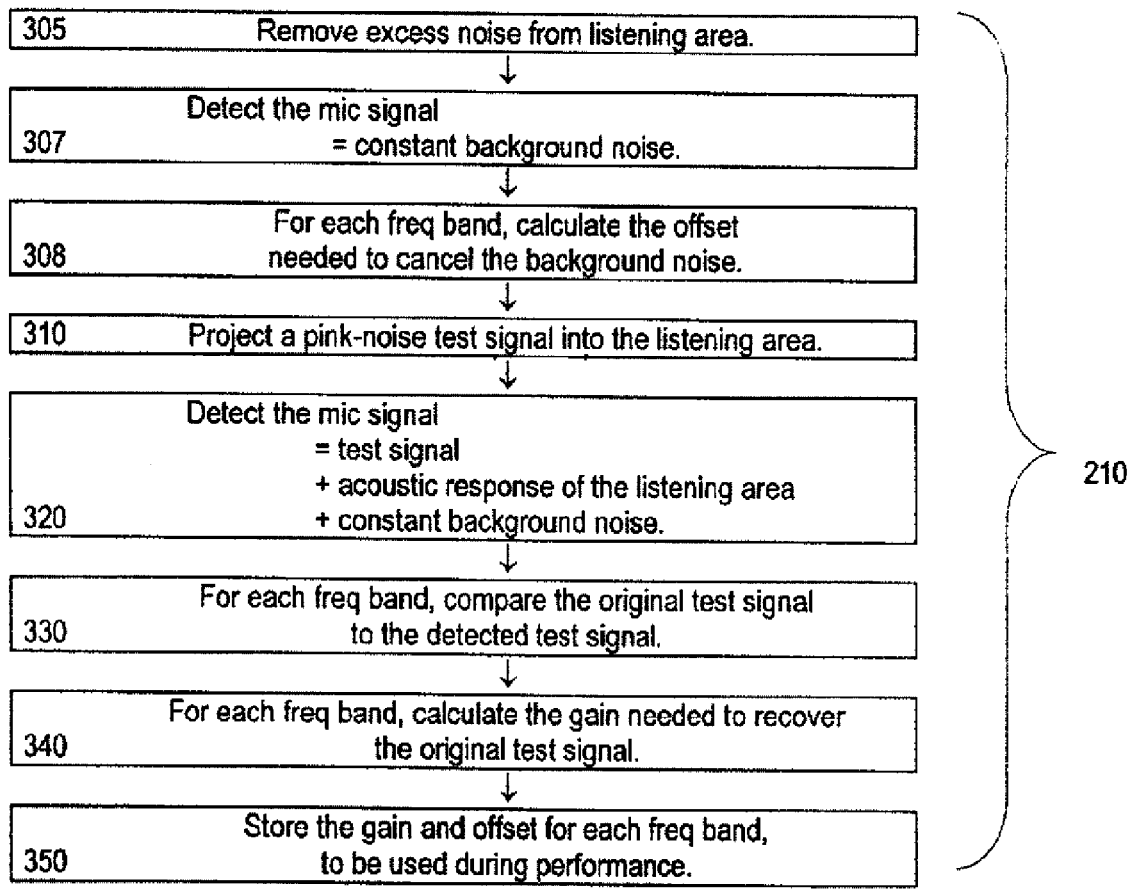
FIG. 3 is a flowchart of the initial calibration phase from the flowchart of FIG. 2.

FIG. 3 is a flowchart of the initial calibration phase 210 from the flowchart of FIG. 2. This implementation depicts the calibration phase as having several components, numbered here as blocks 305, 307, 308, 310, 320, 330, 340, and 350. In block 305 of the calibration phase, the a listening area is prepared by controlling the sources of noise so that undesired noise is reduced to a minimum, preferably as close to silent as possible. Thus, the only sound present is a background noise. In the context of the illustration in FIG. 1, this background is the background noise 165 discussed above. For example, in preparation for a music performance in a concert hall, the calibration phase may be performed late at night, when passing traffic noise is largely absent, with the hall and surroundings largely vacant of audience and personnel, with any non-essential machinery in the vicinity turned off, and with any essential machinery operating in a way that generates a minimum level of noise. The only unintended sounds present during the calibration phase 210 are preferably those sounds that cannot be silenced, and which may thus be expected to persist in the background even during the subsequent operation phase.

In block 307 of FIG. 3, the background noise in the listening area is then detected by microphone 150 and conveyed via the microphone signal 155 to the noise compensation unit 120. In block 308, the microphone signal is analyzed to determine the level of the background noise. This level is considered an offset that indicates the amount of background noise in the listening area. This analysis may be done for each of several frequency bands, and a set of offsets—one for each frequency band—may be measured. These offsets may be used later to analyze sounds detected in the listening area during the operation phase 220.

In block 310 of FIG. 3, a pink-noise test signal is projected into the listening area. This pink noise test signal may span a range of about 20 Hz to 20 kHz. Other test signals may be used, such as a series or combination of discrete tones, or a spectrum of white noise. In the setup depicted in FIG. 1, the test signal is provided to the noise compensation unit 120 as source signal 118. Speakers 130 project the test signal into the listening area 101. The test signal is then detected by microphone 150 and a detected version of the test signal is returned in the microphone signal 155 to the noise compensation unit 120.

Thus, during block 310 the known, original test signal may be used as the source signal 118, and the detected test signal may be received as the microphone signal 155. Before being detected by the microphone, the test signal is naturally modified in the listening area by the acoustic properties of the listening area. These acoustic properties are generally frequency-dependent, as noted above. Thus, different frequency bands of the test signal may experience different modifications. For example, some frequency ranges may be more attenuated than others in the listening area. Additional differences between the original and perceived test signal may also arise from imperfections in construction or placement of the transmitting equipment, such as speakers 130 from FIG. 1. Still further, the perceived test signal may be different from the original test signal because of any background noise present in the listening area.

Block 320 shows detection of the perceived test signal as a microphone signal, such as the microphone signal 155 from FIG. 1. The microphone signal includes all the differences from the original test signal. Like the microphone signal detected in block 307, the microphone signal detected in block 320 includes background noise in the listening area. Additionally, the microphone signal detected in block 320 also includes the originally projected test signal, plus any modifications arising from the acoustic properties of the listening area.

In block 330, the microphone signal is compared with the original test signal and with the background-noise offsets (measured in blocks 307 and 308) to determine the differences between the original test signal and the microphone signal. This comparison may be done separately for each frequency band in a set of frequency bands that span the audible spectrum.

Block 340 depicts the calculation of relative gain factors that help characterize the listening area. The gain factors and the background-noise offsets (measured in blocks 307 and 308) relate the detected test signal to the original test signal. Like the background-noise offsets, the gain factors may be calculated for a set of frequency bands. The gains may be used later to analyze sounds detected in the listening area during the operation phase 220.

The overall calibration phase 210 may be implemented to measure calibration information—such as the gain factors and offsets—in such a way that the original test signal can be substantially recovered when the calibration information is applied to the perceived test signal. As discussed above, the offsets for the various frequency bands indicate the background noise in the listening area. Similarly, the gain factors for the various frequency bands are determined so that they represent an acoustic transfer function of the listening area. Other information may be obtained instead of or in addition to the gain and offset information. For example, phase-shift information, echo and reverberation information, and nonlinear differences between the original and perceived test signal may also be recorded. The gain factors, offsets, and any other calibration results may be stored in block 350 for later use during the operation phase.

Figure 4:
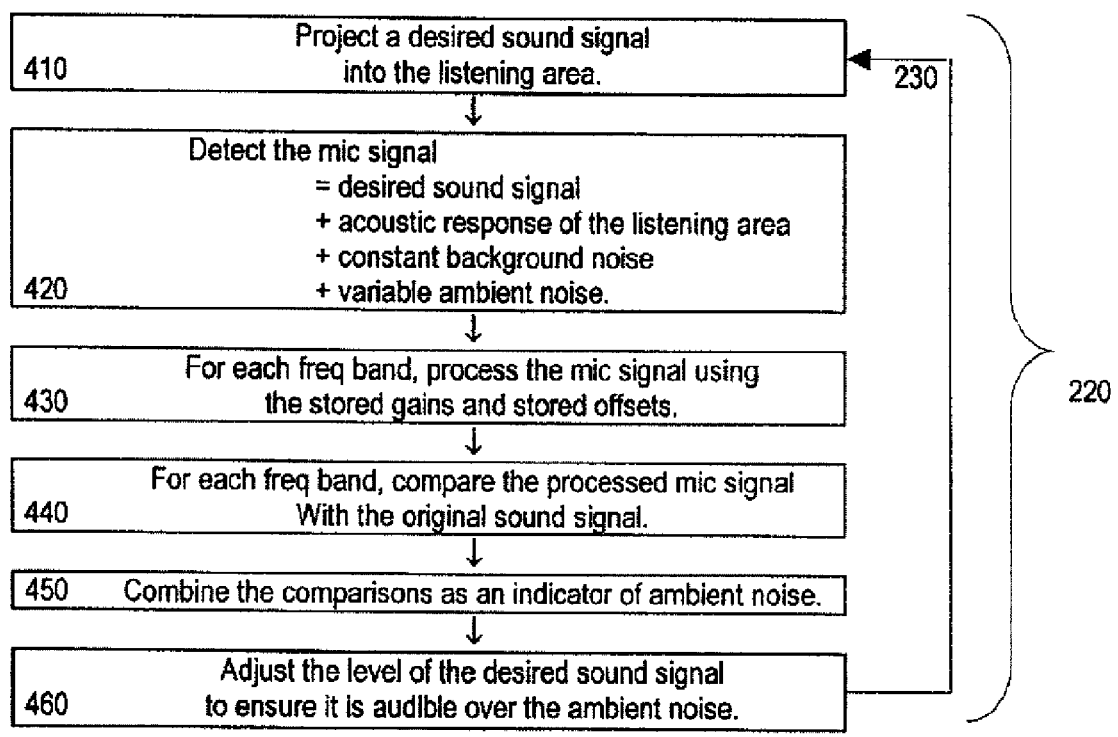
FIG. 4 is a flowchart of the operation phase from the flowchart of FIG. 2.

FIG. 4 is a flowchart of the operation phase 220 from the flowchart of FIG. 2. This implementation depicts the operation phase 220 as having several components, numbered here as blocks 410, 420, 430, 440, 450, and 460. In block 410 of this phase, a desired sound signal, such as a music or voice signal, is projected into the listening area. In the setup from FIG. 1, the desired sound signal is provided to the noise compensation unit 120 as the source signal 118, and speakers 130 project the desired sound signal into the listening area 101.

The sound in the listening area is detected as the microphone signal in block 420. In general, the sound in the listening area is more than the desired sound projected into the listening area in block 410. The sound in the listening area includes any modifications arising from the acoustic response of the listening area (which may have been measured previously in the calibration phase 240). The detected sound also includes the background noise in the listening area (which also may have been measured previously in the calibration phase 240). Further, the detected sound includes any ambient noise in addition to the background noise. As a result, the microphone signal differs from the original desired sound signal.

Referring back to the calibration process shown in FIG. 3, it can be seen that the microphone signal detected during operation (in block 420) resembles the microphone signal detected during calibration (in block 320). Both signals may include the sound projected into the listening area, modifications arising from the acoustic response of the listening area, and background noise in the listening area. However, unlike the microphone signal detected during calibration, the microphone signal detected during operation may also include the ambient noise in the listening area.

Block 430 depicts the processing of the microphone signal to account for the previously measured acoustic properties of the listening area and for the previously measured background noise. The power of the microphone signal may be calculated in each frequency band. These calculated powers are scaled according to previously stored gain factors and reduced by previously stored offsets. For example, the processed power $M'(n)$ in the n'th frequency band may be calculated according to the relation $M'(n):=s(n)M(n)+a(n)$, where $M(n)$ represents the power of the detected microphone signal in the n'th frequency band, $s(n)$ represents the scaling factor for the nth frequency band (which may account for the acoustic properties of the listening area, as measured during the calibration phase), and $a(n)$ represents the offset for the nth frequency band (which may account for the background-noise in the listening area, as measured during the calibration phase).

In block 440, the resulting frequency distribution is compared to the frequency distribution of the original sound signal. Any difference between these distributions may be attributed to ambient noise, which was not present during the calibration phase. The differences are then summed over all frequency bands in block 450 to generate a measurement of the ambient noise. This measurement may then be used as a control signal to adjust the volume of the desired sound signal, as shown in block 460. As indicated by the looping arrow 230, the adjustment in block 460 may understood as a feedback control (or as an iterative adjustment), since this adjustment affects the desired sound signal being projected in block 410. With appropriate adjustments, the volume of the desired sound signal may be adjusted to compensate for changes over time in the ambient noise.

Figure 5:
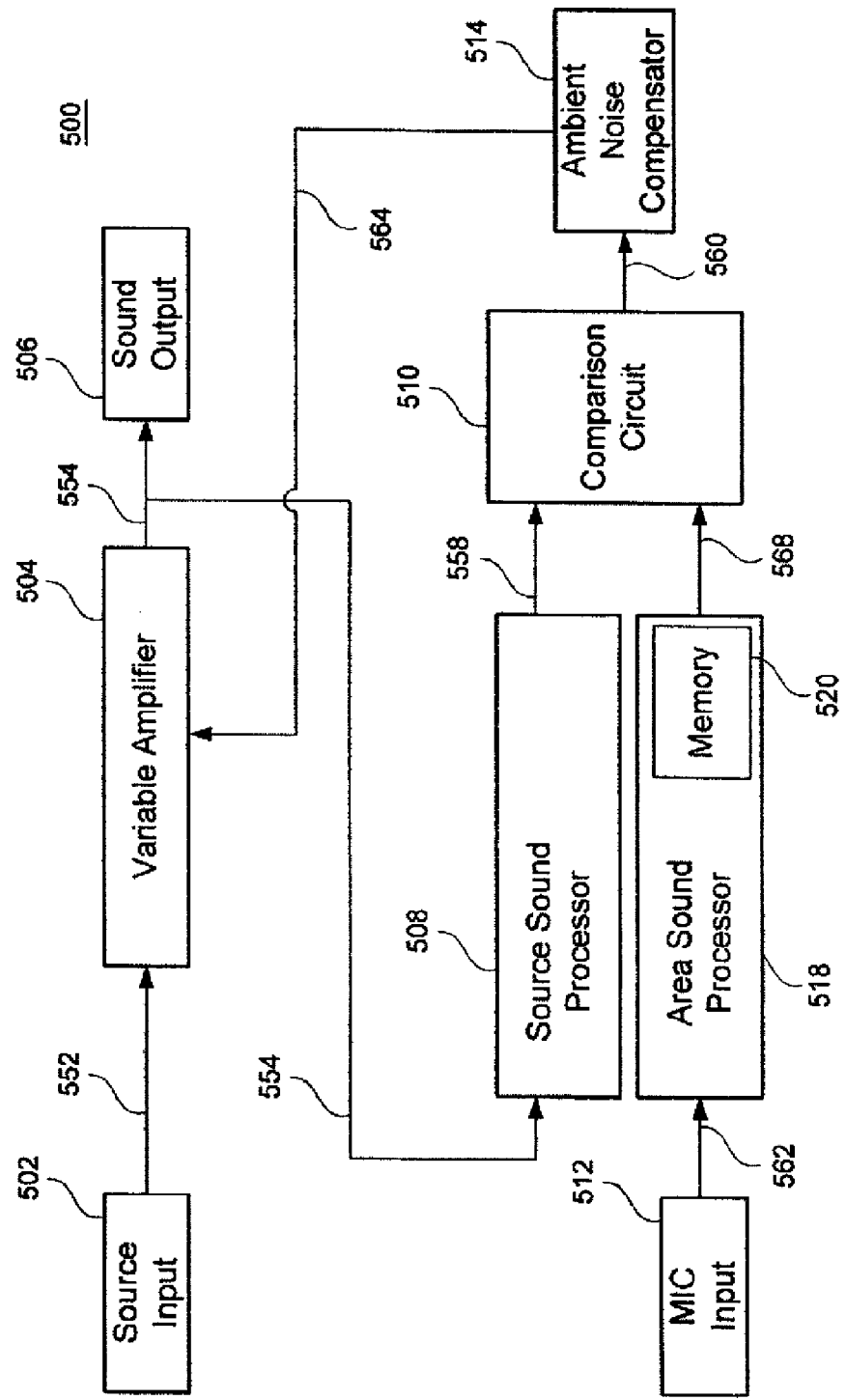
FIG. 5 is a simplified block diagram exemplifying a system to compensate for ambient noise levels.

FIG. 5 is a simplified block diagram exemplifying a system 500 to compensate for ambient noise levels. The system 500 has two inputs and one output, and may be configured into a portable device, such as the noise compensation unit 120 shown in the listening area 101 from FIG. 1. The system 500 includes a source input 502, a microphone input 512, and a sound output 506. Other components of the system 500 include a variable amplifier 504, a source sound processor 508, an area sound processor 518 with a memory 520, a comparison circuit 510, and an ambient noise compensator 514. The variable amplifier 504 connects the source input 502 to the sound output 506, and is further connected to the source sound processor 508. The area sound processor 518 is connected to the microphone input 512. The ambient noise compensator 514 receives signals from the comparison circuit 510, which in turn is connected to the source sound and area sound processors 508 and 518. The ambient noise compensator 514 adjusts the sound level at the sound output 506 through a connection to the variable amplifier 504.

The source input 502 provides an audio input signal 552, such as the source signal 118 from FIG. 1. The source input 502 may be adjustable to provide a minimum signal level for the audio input signal 552. The audio input signal 552 is then provided to variable amplifier 504. Variable amplifier 504 is configured to modify the audio input signal 552 in response to ambient noise in a listening area, as described below. The resulting audio output signal 554 is provided from the variable amplifier 504 to the sound output 506. The sound output 506 may be an interface that provides an audio signal, such as the output signal 125 shown in FIG. 1, to loudspeakers in a listening area.

The audio output signal 554 is also provided to the source sound processor 508, which calculates a source level signal 558 from the audio output signal 554. The source level signal 558 contains information on the sound level of the audio output signal 554. For example, the source level signal 558 may be a collection of audio output signal levels that describe the power spectrum of the audio output signal 554. Alternatively, the source level signal 558 may be a single-valued signal that scales linearly or logarithmically with the instantaneous power of the audio output signal 554. Other representations may also be used in the source level signal 558.

When used in the configuration shown in FIG. 1, the source level signal 558 effectively represents the sound level of the output signal 125 projected into the listening area. As noted above, this signal 125 may be produced by the sound output 506 from the audio output signal 554.

The microphone input 512 provides an microphone input signal 562, such as the microphone signal 155 shown in FIG. 1. The microphone input signal 562 may be a combination of the desired source sound and the undesired background and ambient noise in a listening area. The microphone input 512 may be adjustable to provide a minimum signal level for the microphone input signal 562. From the microphone input 512, the microphone input signal 562 is provided to the area sound processor 518.

The area sound processor 518 calculates a microphone level signal 568 from the microphone input signal 562 and from calibration information stored in the memory 520. This calibration information may describe acoustic characteristics of the listening area, such as an acoustic transfer function of the listening area. The calibration information may also describe persistent background noise in the listening area.

This information about the listening area may then be used during operation, such as in block 430 of the procedure from FIG. 4. In generating the microphone level signal 568, the area sound processor 518 may account for the effects of the listening area's transfer function and background noise. For example, the area sound processor 518 may calculate a power spectrum of the microphone input signal 562, then (1) scale the resulting power spectrum as needed to undo the pre-measured transfer function of the listening area, and (2) subtract a pre-measured power spectrum of the background noise. The source level signal 518 may then be a collection of ambient sound signal levels that describe the power spectrum of the microphone input signal 562, but with the effects of the listening area's transfer function and background noise removed.

Note that when used in the configuration shown in FIG. 1, the microphone input signal 562 represents (a) the output signal 125 projected into the listening area, as modified by (b) the transfer function of the listening area 101, and combined with (c) any constant level background noise 165 and (d) any time-varying ambient noise 145. After being processed in the area sound processor 518, the microphone level signal 568 effectively represents the sound level of only: (a) the audio signal 125 and (d) any time-varying ambient noise 145. The effects of (b) the transfer function of the listening area 101 and (c) the background noise 165 are removed by the area sound processor 518.

As noted earlier, the source level signal 558 represents the sound level of (a) the output signal 125. Thus, any differences between the source level signal 558 and the microphone level signal 568 may be seen as an indicator of only (d) the ambient noise 145.

The source and microphone level signals 558 and 568 are provided to the comparison circuit 510, which calculates an ambient noise level signal 560 from the differences between these signals 558 and 568. The ambient noise level signal 560 may be the difference in sound levels (dB) between the source and microphone level signals 558 and 568. This difference in sound levels may be used as a measurement of the ambient noise (in dB) present in the microphone signal 562. The comparison circuit 510 operates on the foregoing observation that differences between these signals 558 and 568 represents ambient noise that is neither desired sound (represented in source level signal 558) nor background noise (represented by measurements stored in memory 520) nor an effect of the listening area's transfer function (also stored in memory 520). The ambient noise level signal 560 thus contains information on the level of ambient noise in the microphone input signal 562.

The ambient noise compensator 514 receives the ambient noise level signal 560 from the comparison circuit 510 and calculates a compensation signal 564 in response. The compensation signal 564 is sent back to the variable amplifier 504 to adjust the level of the audio output signal 554 in response to ambient noise. As the ambient noise in the listening area increases, ambient noise compensator 514 increases the audio output signal 554 up to a maximum level, and as the noise in a listening area decreases, the ambient noise compensator 514 decreases audio output signal 554 down to a minimum level.

As mentioned above, the ambient noise compensator 514 may generate the compensation signal 564 in such a way as to ensure that the audio output signal 554 has a sound level that is higher than the ambient noise, but which is not higher than a predetermined limit. This calculation may use two user-defined control parameters. The first control parameter, called the sensitivity, indicates the desired signal-to-noise ratio between the audio output signal 554 and the ambient noise in the microphone input signal 562. The second control parameter, called the max boost, limits the maximum amount of gain that the system 500 will add in response to ambient noise. Guided by the compensation signal 564, the variable amplifier 504 amplifies the audio output signal 554 to achieve the desired sensitivity, while limiting the amplification as prescribed by the max boost. An implementation of the system 500 that uses these two control parameters is described below, with reference to FIGS. 6 and 8.

Regarding the calibration information stored in memory 520, this calibration information may be obtained during a pre-performance calibration, such in blocks 308 and 340 of the procedure from FIG. 3. The system 500 may be configured to measure the calibration information during the calibration procedure. For example, a known test signal may be applied at the source input 502. The calibration information may then be iteratively selected by area sound processor 520 and comparison circuit 510 so that the microphone level signal 568 is brought to match band-by-band with the source level signal 558.

Figure 6:
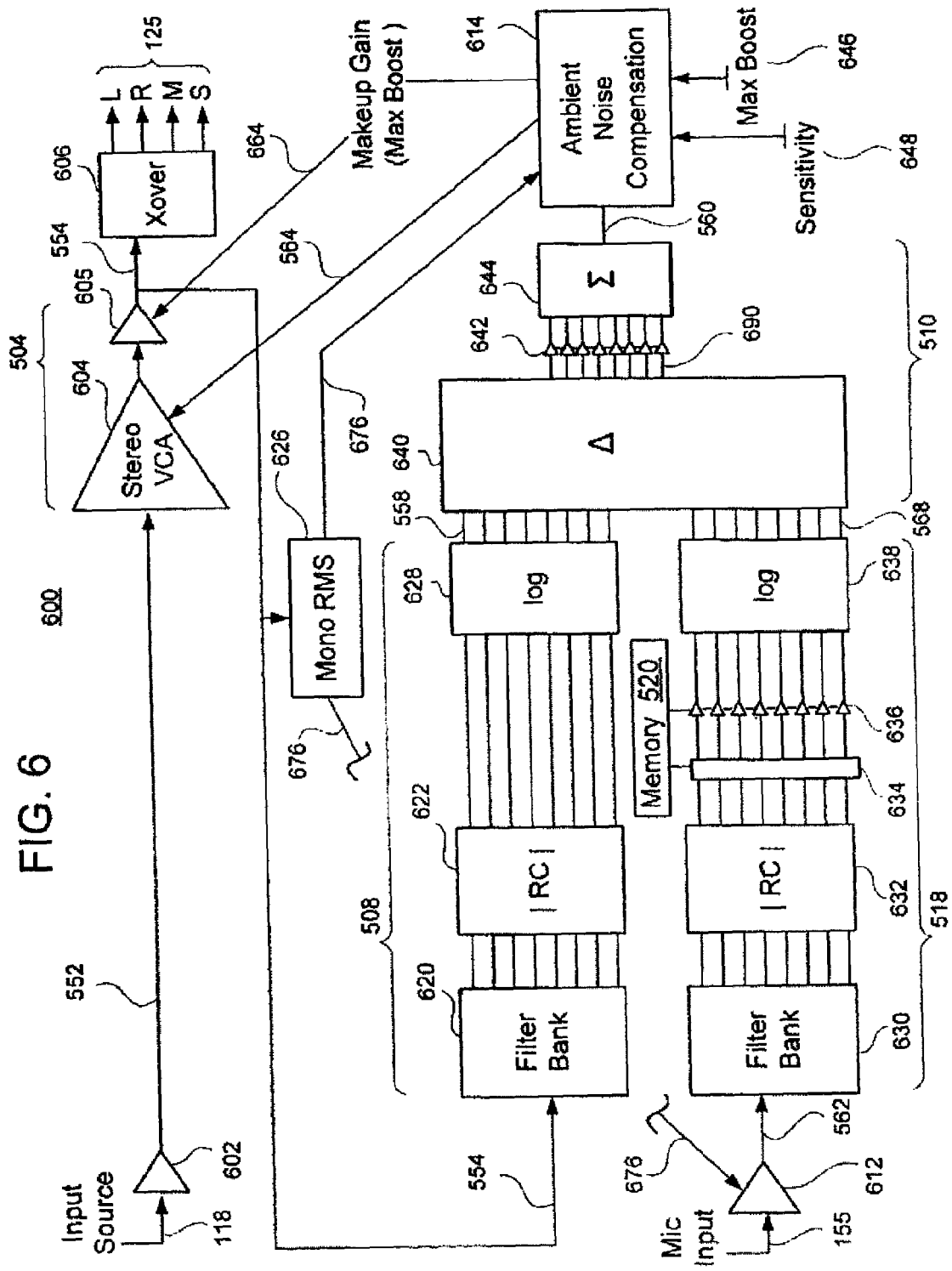
FIG. 6 is a block diagram illustrating an implementation of the system from FIG. 5.

FIG. 6 is a more detailed block diagram of a particular implementation 600 of the system from FIG. 5. The implementation 600 includes a source input stage 602, a microphone input stage 612, and a crossover circuit 606, which implement the source input 502, the microphone input 512, and the sound output 506, respectively, from FIG. 5. A stereo voltage controlled amplifier (VCA) 604 and a makeup gain amplifier 605 serve as interconnected components of the variable amplifier 504. A filter bank 620, a running-average block 622, and a logarithm block 628 may be connected in series, and serve as components of the source sound processor 508.

The area sound processor 518 may be similarly implemented by another filter bank 630, running-average block 632, and logarithm block 638, along with a background removal stage 634, and a gain stage 636. These subcomponents may also be connected in series, starting with the filter bank 630, then the running-average block 632, the background removal stage 634, the gain stage 636, and finally the logarithm block 638. The memory 520 from FIG. 5 may be coupled to the gain stage 636 and to the background removal stage 634.

The comparison circuit 510 from FIG. 5 is present in the implementation 600 as a difference block 640, a band scaling block 642, and a summer 644 connected in series. The ambient noise compensator 514 from FIG. 5 is presented in the implementation 600 as an ambient noise compensation block 614. Implementation 600 also includes a mono RMS detector 626, coupled to the makeup gain amplifier 605, to the microphone input stage 612, and to the ambient noise compensation block 614.

The various components of implementation 600 may be realized as a combination of software and hardware, such as with an appropriate set of computer instructions running on a digital signal processor. Another realization of implementation 600 uses a variety of interacting digital circuits to form the various blocks. These realizations of implementation 600 are "digital," in the sense that all of the components are programmed or hard-wired logic elements, and all of the signals are digital signals or digital information. Alternatively, implementation 600 may also be realized with discrete components that communicate with each other using voltage signals. This alternative realization is considered "analog," in the sense that all of the signals are voltages that represent scalar values. More generally, implementation 600 may be created from a combination of analog and digital components, so that some of the various signals communicated among the blocks are digital signals, and some of the signals are analog signals. The selection of all-analog, all-digital, or combinations of signals will vary according to a designer's particular needs, taking into account specific factors such as availability and costs of components, manufacturing costs, power consumption, performance requirements, tolerances, interfaces with external circuitry, and other factors known to the particular designer.

In FIG. 6, the implementation 600 is illustrated as being configured into the noise compensation unit 120 from FIG. 1. The source input stage 602 is shown as receiving the source signal 118. The microphone input stage 612 is shown as receiving the microphone signal 155. The crossover circuit 606 is shown as producing the output signal 125. It is noted that the implementation 600 may be used in a variety of other settings, depending on the needs of a particular situation, and that other signals may accordingly be provided to and generated by the source input stage 602, the microphone input stage 612, and the crossover circuit 606.

Internally, the source input stage 602 generates the audio input signal 552 from the source signal 118. Generally, audio input signal 552 is a stereophonic audio signal from any of a variety of sources such as, for example, the playback of an audio recording, or an audio signal from a live performance, or a combination of live and pre-recorded signals. The source input stage 602 may receive a user-controlled input (not shown) to adjust the minimum signal level when the system 600 is used with different audio sources. The audio input signal 552 is sent through the stereo VCA 604, and from there to the makeup gain amplifier 605, both of which are further described below. These components 604 and 605 adjust the level of the audio input signal 552 to create the audio output signal 554. The audio output signal 554 is provided to the crossover circuit 606, which sends the output source signal to a plurality of loudspeakers in the area as the output signal 125. In FIG. 6, the output signal 125 is depicted as a set of four signals L, R, M, and S, which represent separate signals for left, right, mono, and subwoofer speakers.

The mono RMS detector 626 receives the audio output signal 554 from the makeup gain amplifier 605, and calculates a monophonic sound level 676 of the audio output signal 554. The monophonic sound level 676 is used to determine a base level for comparisons in subsequent signal processing, as noted below.

The audio output signal 554 is then passed through the filter bank 620, where the audio output signal 554 is split into a plurality of separate frequency bands by a plurality of bandpass filters. Each bandpass filter allows signals in a certain desired frequency range to pass through, and attenuates signals outside the desired frequency range. The number and frequency range of the band pass filters in the filter bank 620 may cover some or all of the frequencies in the audible acoustic range, which is generally considered to span from about 20 Hz to about 20 kHz.

In the implementation 600 illustrated in FIG. 6, the filter bank 620 uses eight band pass filters to split audio output signal 554 into eight band signals, each of which have separate frequency ranges. These separate ranges are bands from about 100 Hz to about 145 Hz, from about 145 Hz to about 211 Hz, from about 211 Hz to about 307 Hz, from about 307 Hz to about 447 Hz, from about 447 Hz to about 650 Hz, from about 650 Hz to about 944 Hz, from about 944 Hz to about 1372 Hz, and from about 1372 Hz to about 2000 Hz. Fewer filters may be used to save costs such as fabrication and processing power. Alternatively, more filters may be used to enhance the discrimination ability of the system.

Once the audio output signal 554 is sent through the filter bank 620, the resulting band-limited signals may be sent to the running-average block 622, which calculates a running average of the absolute value for each band signal. In the running-average block 622, the band-limited signals are each smoothed by an appropriate time constant, analogous to an RC time constant in a rectified RC filter. Depending on the design of other aspects of the system, this time constant may reflect a short integration, in the range of 0.25 seconds to 2 seconds, or a long integration, in the range of approximately 30 seconds. Alternatively, instead of averaging the band-limited signals, the running-average block 622 may be designed to first identify the peak levels of the band-limited signals in each of a series of short (0.5 to 1 sec) windows, and then calculate the running average of these peak values, thereby increasing the system's sensitivity to periodic bursty sound, such as a series of drumbeats or cowbell hits. Other approaches are also envisioned for the running-average block 622, so that the outputs of the block 622 indicate a long-term average of the power in each frequency band.

The outputs of the running-average block 622 may pass through the logarithm block 628, which converts the power approximations from running-average block 622 into logarithmic representations of source signal levels. These logarithmic representations are the source level signal 558, and are provided to the difference block 640. In the difference block 640, each individual logarithmic signal from the source level signal 558 may be compared with a corresponding signal derived from the microphone input signal 562.

In parallel with the processing of the audio output signal 554 through blocks 620, 622, and 628, the microphone input signal 562 is also processed by blocks 630, 632, 634, 636, and 638. These blocks generate the microphone level signal 568 from the microphone input signal 562.

The microphone input stage 612 receives the microphone signal 155 and generates the microphone input signal 562 in response. The microphone input stage 612 may receive a user-controlled input (not shown) to adjust the minimum signal level of the microphone input signal 562 as needed when different types of microphone signals are used. Additionally, during calibrations (such as the calibration phase 210 from FIG. 2) the source input stage 612 may also normalize the microphone input signal 562 according to the monophonic sound level 676, so that components of microphone input signal 562 may be properly compared against components of the audio output signal 554. Alternatively, this normalization may be performed at a later stage in the signal processing, such as, for example, in the difference block 640, or in ambient noise compensation block 614.

From the microphone input stage 612, the microphone input signal 562 may be sent to the filter bank 630. A set of bandpass filters in the filter bank 630 split the microphone input signal 562 into a set of frequency-band signals. The number and frequency ranges of the bandpass filters in the filter bank 630 for the microphone signal match the number and frequency ranges of the bandpass filters in the filter bank 620 for the source signal, discussed above. As illustrated, the filter bank 630 in implementation 600 uses eight bandpass filters to generate eight band-limited signals. To match the frequency bands used in the filter bank 620, the bandpass filters in filter bank 630 have band ranges from about 100 Hz to about 145 Hz, from about 145 Hz to about 211 Hz, from about 211 Hz to about 307 Hz, from about 307 Hz to about 447 Hz, from about 447 Hz to about 650 Hz, from about 650 Hz to about 944 Hz, from about 944 Hz to about 1372 Hz, and from about 1372 Hz to about 2000 Hz.

The resulting band-limited signals may be provided from the filter bank 630 to the running-average block 632, which calculates a running average of the absolute value for each band-limited signal. In the running-average block 632, the band-limited signals are each smoothed by an appropriate time constant, analogous to an RC time constant in a rectified RC filter. As discussed earlier with reference to the running-average block 622 in the source sound processor 508, various implementations of the running-average block 632 are envisioned. The outputs of the running-average block 632 may approximate a long-term average of the power in each frequency band. The outputs of the running-average block 622 may then be processed in the background removal stage 634 and the gain stage 636.

In the background removal stage 634, the outputs of the running-average block 632 may be adjusted with separate offsets for each frequency band. The offsets may be determined during the calibration procedure (such as in the block 308 of FIG. 3) and then stored in the memory 520. During operation, the background removal stage 634 recalls the offsets from the memory 520 and reduces the microphone signal levels for each frequency band according to the offsets.

The outputs of the background removal stage 634 are provided to the gain stage 636. In the gain stage 636, the outputs of the running-average block 632 may be further adjusted individually with separate gain factors for each frequency band. The gain factors may be determined during a calibration procedure (such as the block 340 of FIG. 3) and then stored in the memory 520. During operation, the gain stage 636 recalls the gain factors from the memory 520 and scales the microphone signal levels for each frequency band according to the gain factors.

After the offsetting and scaling of blocks 634 and 636, the outputs of the gain stage 636 may be converted in the logarithm block 638 into logarithmic representations of microphone signal levels. These logarithmic representations are the microphone level signal 568, and may be provided to the difference block 640.

The difference block 640 receives the eight frequency-band components of the logarithmic source level signal 558, and also receives the eight frequency-band components of the logarithmic microphone level signal 568. The difference block 640 then compares the source and microphone level signals 558 and 568 band-by-band, calculating the difference between the logarithmic levels for each of the eight frequency bands. These differences are output from the difference block 640 as a set of difference signals 690, including one difference signal for each of the frequency bands.

The difference signals 690 are the measurement of interest during a calibration such as the calibration phase 210 of FIG. 2. During such a calibration, the offsets in background removal stage 634 and the gains in gain stage 636 are selected so that the difference signals 690 are driven substantially to zero. The selection of gains may be achieved by an iterative procedure or by a direct computation, or by a combination of iterations and computations. Nullifying these differences means that the gains and offsets are selected so that the source and microphone level signals 558 and 568 match each other in each frequency band during the calibration procedure.

In other words, during calibration—when extraneous ambient noise is absent, the microphone level signals 558 are modified by driving the difference between each band's microphone level source level to zero. When the difference of each band's microphone and source signal is zero, the background removal stage 634 has been calibrated to remove the effects of constant-level background noise that are present in the microphone input signal 562. Further, at this point the gain stage 636 has been calibrated to remove the effects of the room having a non-flat frequency response. When the calibration is complete, and the final gains and offsets are stored in memory 520.

During operation, such as in the operation phase 220 from FIG. 2, the offsets are loaded from memory 520 into the background removal stage 634 and the gains are loaded from memory 520 into the gain stage 636. The background removal stage 634 and the gain stage 636 then modify the microphone input signal 562 by removing the effects of constant-level background noise and the effects of the room having a non-flat frequency response.

With this conditioning, any differences between the source and microphone level signals 558 and 568 may be attributed to time-varying ambient noise. This is expected because the ambient noise is the only component of the microphone input signal 562 that cannot be anticipated by any combination of the offsets in background removal stage 634, the gains in the gain stage 636, and the source level signal 558. During operation, then, the difference signals 690 generated by the difference stage 640 are indicators of ambient noise in each of the frequency bands. The summer 644 receives these difference signals 690 and arithmetically adds the difference signals 690 together to generate the ambient noise level signal 560.

The summer 644 also may combine the difference signals 690 according to other protocols to generate the ambient noise level signal 560. For example, the summer 644 may be configured to exponentiate the individual difference signals 690, arithmetically add the exponentials together, and then calculate a logarithm of the sum to generate the ambient noise level signal 560.

The ambient noise level signal indicates the amount of ambient noise in a listening area. One measure for indicating this noise is as a signal to noise ratio that indicates (in dB) the amount of ambient noise present, relative to the amount of desired sound. Other useful measures of indicating the ambient noise may also be used for the ambient noise level signal 560.

Prior to being added together in the summer 644, the difference signals 690 may be processed in band scaling block 642. Band scaling block 642 may have a configuration similar to that of gain stage 636. This block 642 applies individual scaling factors to each of the difference signals 690. Unlike the calibrated gains used in gain stage 636, the scaling factors in band scaling block 642 may be user-specified parameters and may be adjusted during operation or derived from additional calibration tests. Alternatively, the scaling factors may be factory-preset constants.

The scaling factors in band scaling block 642 reflect the different weights that should be accorded to ambient noise in the various frequency bands. The band scaling block 642 allows for variations in the significance of the noise signal in the frequency bands. This feature allows the system to boost the source signal more in response to some types of noise than others. For example, a user may recognize that a substantial amount of ambient noise appears in bursts in the 944 Hz to 1372 Hz frequency band from the clatter of cutlery in a particular listening area. If the user wishes for the system to ignore these temporary bursts of ambient noise, she may decide to reduce the weight given to the component for this frequency band in difference signal 690. By adjusting the corresponding scaling factor in band scaling block 642 to a low setting, the user can prevent the cutlery noise from contributing to the ambient noise level signal 560. To exclude other sources of ambient—but unimportant—noise, other scaling factors in band scaling block 642 can be similarly adjusted.

Once the components of the difference signal 690 have been added together, the ambient noise level signal 560 is sent from the summer 644 to the ambient noise compensation block 614. Using the ambient noise level signal 560, the ambient noise compensation block 614 calculates the compensation signal 564. As discussed above, the compensation signal 564 is the signal sent to the stereo VCA 604 to keep the audio output signal 554 at a desired level above the ambient noise. The desired margin may be indicated by a sensitivity 648, which is a user parameter provided to the ambient noise compensation block 614. The compensation signal 564 may also be tailored to prevent the audio output signal 554 from increasing beyond a certain level. This maximum level is set by the max boost 646, which is another user parameter provided to the ambient noise compensation block 614.

For example, the sensitivity 648 may be user adjustable. The sensitivity 648 may be set to keep the source signal six decibels above the ambient noise in a listening area. The ambient noise compensation block 614 then examines the ambient noise level signal 560 and gives the compensation signal 564 an appropriate value so that in the listening area the desired sound is effectively 6 dB greater in volume than the ambient noise, but not greater in volume than whatever value is specified by the max boost 646.

The ambient noise compensation block 614 may also receive the monophonic sound level 676 from ambient noise compensation block 614. Using this signal 676, the ambient noise compensation block 614 may monitor the net level of the audio output signal 554. If the monophonic sound level 676 decreases below a threshold level or disappears, as sometimes happens between songs or during a pause in a speech, the ambient noise compensation block 614 may refrain from adjustments of the source signal level until the monophonic sound level 676 again increases above a desired threshold level.

In the implementation 600 depicted in FIG. 6, the compensation signal 564 is an attenuation signal that reduces the level of the signal generated by stereo VCA 604. Stereo VCA 604 then provides only attenuation to the audio input signal 552. The output of stereo VCA 604 is then provided to the makeup gain amplifier 605, which provides a constant amount of amplification, as determined by a makeup gain signal 664. This arrangement of the stereo VCA 604 and the makeup gain amplifier 605 ensures that the audio output signal 554 never exceeds a level determined by the makeup gain signal 664, which is fixed by the user-controlled max boost setting 646.

Like the compensation signal 564, the makeup gain signal 664 is generated by the ambient noise compensation block 614. The value of the makeup gain signal 664 may be determined solely by the max boost setting 646. The ambient noise compensation block 614 gives the makeup gain signal 664 an appropriate value so that the maximum output of the makeup gain amplifier 605 is at a level corresponding to the desired max boost 646.

When the listening area has no ambient noise, the ambient noise compensation block 614 generates the compensation signal 564 with a value for full attenuation, and the stereo VCA 604 applies this large attenuation. Conversely, when the listening area has a very large amount of ambient noise, the compensation signal 564 has a value for little or no attenuation, and the stereo VCA 604 applies little or no attenuation. The makeup gain signal 664 is configured so that when an unattenuated output from the stereo VCA 604 is amplified by the makeup gain amplifier 605, the resulting signal has the level specified by the max boost 646. This final signal is the audio output signal 554. This arrangement ensures that the audio output signal 554 does not exceed the prescribed max boost 646.

The stereo VCA 604 may be a voltage controlled amplifier that amplifies the source signal exponentially. Thus, the input to the stereo VCA 604 may be a logarithmic signal, such as a decibel specification or a power-of-two specification of the desired attenuation. One example of the makeup gain amplifier 605 may be set to any amplification value between zero and eighteen decibels. Other configurations of the stereo VCA 604 and the makeup gain amplifier 605 also may be used.

Based on the amount of ambient noise in the microphone input signal 562, then, the ambient noise compensation block 614 effectively increases or decreases the audio output signal 554 to maintain the desired margin between the source signal and the ambient noise. Further, the ambient noise compensation block 614 prevents the source signal from being adjusted if the source signal decreases below a threshold or disappears altogether, and also prevents the source signal from being increased above a maximum acceptable signal level, as specified by the maximum boost setting 646.

Figure 7:
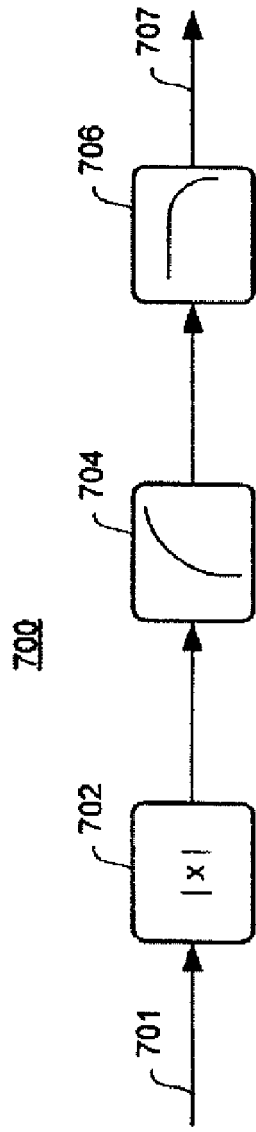
FIG. 7 is a block diagram of a logarithmic level estimator usable in blocks 628 and 638 from FIG. 6.

FIG. 7 is a block diagram of one embodiment of a logarithmic level estimator 700 that may be used in the logarithm blocks 628 and 638 from FIG. 6. As described above, these blocks 628 and 638 convert the power approximations from blocks 622 and 636 into logarithmic representations of source signal levels.

To complete the logarithmic conversion, first an absolute value stage 702 rectifies the input 701 (which may be a source signal or a microphone signal). The result from the absolute value stage 702 is then sent to a logarithmic polynomial approximation stage 704, where a polynomial equation is used to closely approximate the logarithmic value of the rectified input. Finally, the result from the logarithmic polynomial approximation stage 704 is sent through a low pass filter stage 706 to generate the output 707. The result achieved is a good short term average approximation for the logarithmic value of the total absolute-value signal power present in the input source or microphone signal. The above process is performed similarly in both the source logarithm block 628 and the microphone logarithm block 638 discussed above.

Variations on the logarithmic level estimator 700 may be made as appropriate for a particular system, in light of speed, accuracy, and processing efficiency needs. For example, instead of simply rectifying the input 701, the absolute value stage 702 of the logarithmic level estimator 700 may square, accumulate, and then square-root the input 701. The resulting output 707 would then be an RMS measure of short term average signal power. Further, in some variations of implementation 600, a single logarithmic level estimator 700 may be used for both of the logarithm blocks 628 and 638, by sharing the logarithmic level estimator 700. This sharing may be achieved, for example, by time-division multiplexing. Also, portions of the logarithmic level estimator 700 of the system implementation 600 may be combined with other operational units, such as filter banks 620 and 630, or with running-average blocks 622 and 632, rather than being in distinct logarithm blocks 628 and 638.

Figure 8:
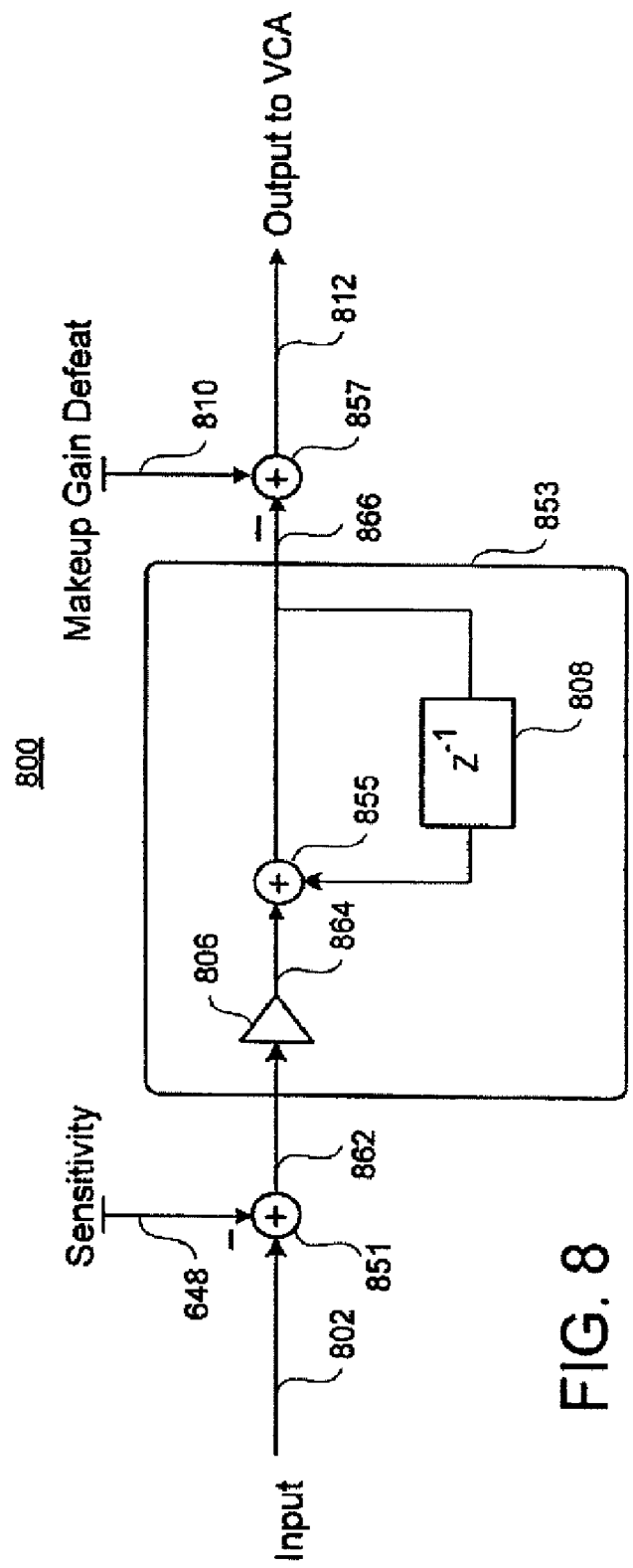
FIG. 8 is a block diagram of an ambient noise compensator usable in block 614 from FIG. 6.

FIG. 8 is a block diagram of an ambient noise compensator 800 that may be used in block 614 from FIG. 6. The input 802 to the ambient noise compensator 800 is the sum created by summer 644 from all the difference signals. This sum represents the instantaneous signal to (ambient) noise ratio in the room, such that a positive input 802 indicates additional ambient noise was measured in a microphone signal. The desired signal to noise ratio, or sensitivity 648, is subtracted from the input 802. If the resulting difference 862 is non-zero, the amount of boost for the system output (such as the audio output signal 554 from FIG. 6) may need to change in order to achieve the desired signal to noise ratio. In this sense the difference 862 is an error signal that directs the corrective action to be taken.

To effect this change, the error 862 is first integrated in time in an integration block 853, to generate an ambient control voltage 866. Inside integration block 853, the error 862 may be multiplied by a small attack/release rate factor at a scaling block 806, and the resulting scaled error 864 is added to the previous ambient control voltage, generated by a delay block 808 from the ambient control voltage 866. The sum of the scaled error 864 with the previous ambient control voltage is the ambient control voltage 866. The delay block 808 introduces a fixed temporal delay that depends on particular implementations and clock rates; thus the time constant of the integration block may be controlled by the attack/release rate factor at block 806. This factor may be chosen so that the integration block 853 has a time constant on the order of 30 seconds. This relatively large time constant sets the response time of the system: thus, the system may respond gradually to changes in ambient noise levels over a time scale of 30 seconds. Other time constants may also be selected, such as time constants of approximately 5 sec, 10 sec, 20 sec, 45 sec, 1 min, 2 min, or 10 min.

Finally, the ambient control voltage 866 is subtracted from a makeup gain defeat 810. The makeup gain defeat 810 is a parameter that may be derived directly from the max boost 648 discussed previously with reference to FIG. 6. The makeup gain defeat 810 is a control voltage used to pre-attenuate the gain that will be subsequently re-applied by the makeup gain amplifier 605 of FIG. 6.

The output 812 of the ambient noise compensator 800 is the result of subtracting the ambient control voltage 866 from the makeup gain defeat 810. This output 812 may be used as the compensation signal 564 of FIG. 6. As the amount of ambient noise in the listening area goes up, the ambient control voltage 866 increases and removes the attenuating effect of the makeup gain defeat 810. The overall gain from the stereo VCA 604 and the makeup gain amplifier 605 then increases, raising the level of the audio output signal 554. If there is enough ambient noise in the listening area, this increase will continue until the ambient control voltage 866 has removed all of the makeup gain defeat 810, and the overall system gain will be at the max boost setting 646.

Conversely, if the amount of ambient noise in the listening area goes down, the ambient control voltage 866 decreases and restores the attenuating effect of the makeup gain defeat 810. The overall gain from the stereo VCA 604 and the makeup gain amplifier 605 then decreases, lowering the level of the audio output signal 554. If there is a low enough ambient noise level in the listening area, this decrease will continue until the signal level reaches a predetermined minimum level appropriate for the listening area, which is set by source input stage 602.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

We claim:

1. A method of compensating for noise in a listening area, comprising:
   receiving an audio input signal;
   scaling the audio input signal according to a feedback adjustment signal to generate an audio output signal;
   receiving an ambient sound input signal;
   calculating a set of audio output levels, where each audio output level from the set of audio output levels is indicative of the audio input signal in a corresponding frequency band from a set of frequency bands;
   calculating a set of running averages based on the set of audio output levels;
   calculating a set of ambient sound levels, where each ambient sound level from the set of ambient sound levels is derived from the ambient sound input signal in a corresponding frequency band from the set of frequency bands;
   calculating a set of running averages based on the set of ambient sound levels;
   comparing the set of running averages of the audio output levels and the set of running averages of the ambient sound levels; and generating the adjustment signal in response to the comparing.

2. The method of claim 1 where the calculating of the running average of each of the audio output levels approximates a short term average.

3. The method of claim 1 where the calculating of the set of running averages of the audio output levels approximates a long term average.

4. The method of claim 1 where the calculating of the set of running averages of the ambient sound levels approximates a short term average.

5. The method of claim 1 where the calculating of the set of running averages of the ambient sound levels approximates a long term average.

6. The method of claim 1 where the comparing comprises subtracting the set of running averages of the audio output levels from the set of running averages of the ambient sound levels.

7. The method of claim 6 further comprising applying individual sealing factors to each difference signal resulting from the comparison of the set of running averages of the audio output levels and the set of running averages of the ambient sound levels.

8. The method of claim 7, where the individual scaling factors are user programmable.

9. The method of claim 6 further comprising summing the difference signals resulting from the comparison of the set of running averages of the audio output levels and the set of running averages of the ambient sound levels to generate an ambient noise level signal.

10. The method of claim 9 where the adjustment signal is generated from the ambient noise level signal.

* * * * *